United States Patent [19]
Chang

[11] Patent Number: 5,916,370
[45] Date of Patent: Jun. 29, 1999

[54] SEMICONDUCTOR PROCESSING CHAMBER HAVING DIAMOND COATED COMPONENTS

[75] Inventor: Chow Ling Chang, Austin, Tex.

[73] Assignee: Applied Materials, Inc., Santa Clara, Calif.

[21] Appl. No.: 09/097,226

[22] Filed: Jun. 12, 1998

[51] Int. Cl.[6] .................................................. C23L 16/00
[52] U.S. Cl. ......................... 118/729; 118/728; 118/500
[58] Field of Search ................................. 118/728, 729, 118/500

[56] References Cited

U.S. PATENT DOCUMENTS 5,720,818  2/1998  Donde ...................................... 118/728
5,725,673  3/1998  Anderson ................................. 118/725

*Primary Examiner*—Richard Bueker
*Attorney, Agent, or Firm*—Blakely Sokoloff Taylor & Zafman

[57] ABSTRACT

A semiconductor processing chamber having diamond coated components.

20 Claims, 4 Drawing Sheets

SEMICONDUCTOR PROCESSING CHAMBER HAVING DIAMOND COATED COMPONENTS

FIELD OF THE INVENTION

The present invention relates generally to semiconductor processing chambers, and more specifically to a semiconductor processing chamber having one or more diamond coated components.

BACKGROUND TO THE INVENTION

Semiconductor chips are manufactured by processing a wafer in respective semiconductor processing chambers. Such processing may include chemical vapor deposition (CVD), physical vapor deposition (PVD), or any other processing which is known in the art. The processing chamber used for each process is designed for purposes of carrying out the respective process. The process of depositing layers on a semiconductor wafer substrate usually involves placing the substrate on a silicon carbide coated graphite susceptor in a thermal reactor chamber and holding the wafer within a stream of a reactant gas flowing across the surface of a wafer. The thermal reactor may be heated by external lamps which pass infra-red radiation into the reactor chamber through heating ports. The heating ports are typically positioned both above and below the susceptor. The heating ports are covered by quartz windows that are transparent to the infra-red radiation. The susceptor positions and rotates the wafer during the deposition process. A pyrometer aimed at the back of the susceptor is generally used to detect the temperature of the susceptor during processing and to serve as an input to a controller that controls power to the external lamps.

During processing, the deposition film is also deposited on the surfaces of other components within the reactor chamber, including the susceptor. For example, during a high temperature nitride process, silicon nitride is deposited on the internal walls of the chamber and also on the silicon carbide coated graphite susceptor. As the deposition layer thickens the silicon nitride may flake and introduce unwanted particulates into the processing chamber. In addition, the emissivity of the susceptor will change as a result of the deposited silicon nitride film. As the emissivity changes, the ability of the pyrometer to accurately monitor the temperature of the susceptor is compromised thus limiting the precision at which a deposition layer may be deposited. For these reasons, an in-situ etch cleaning process is periodically used to etch the silicon nitride film from the susceptor and chamber walls, including the quartz windows. Typically a fluorine containing gas ($NF_3$) is used to clean the deposited film from the surface of the susceptor. Since it is difficult to precisely control and monitor the etch rate of the deposited film, it is not uncommon for the silicon carbide coating of the susceptor to be etched during the cleaning process. After a portion of the silicon carbide coating is fully removed, the graphite susceptor will itself be subject to attack by the etchant.

Removal of the silicon carbide coating not only exposes the graphite susceptor to the etchant gas, but also affects the emissivity of the susceptor. This, in turn, affects the thermal characteristics of the susceptor making it more difficult to precisely control the temperature of the wafer during processing. Moreover, etching of the graphite body reduces the structural integrity of the susceptor itself.

SUMMARY OF THE INVENTION

In accordance with the present invention, a semiconductor processing chamber is provided having one or more diamond coated components. In one embodiment, a diamond coated susceptor is provided for supporting a wafer substrate in the semiconductor processing chamber.

BRIEF DESCRIPTION OF THE DRAWINGS

The invention is further described by way of example with reference to the accompanying drawings wherein.

DESCRIPTION OF PREFERRED EMBODIMENT

In the following description, numerous specific details are set forth, such as material types, dimensions, etc., in order to provide a thorough understanding of the present invention. However, it will be obvious to one of ordinary skill in the art that the invention may be practiced without these specific details. In other instances, well-known structures and processing steps have not been shown in particular detail in order to avoid unnecessarily obscuring the present invention.

Figure 1:
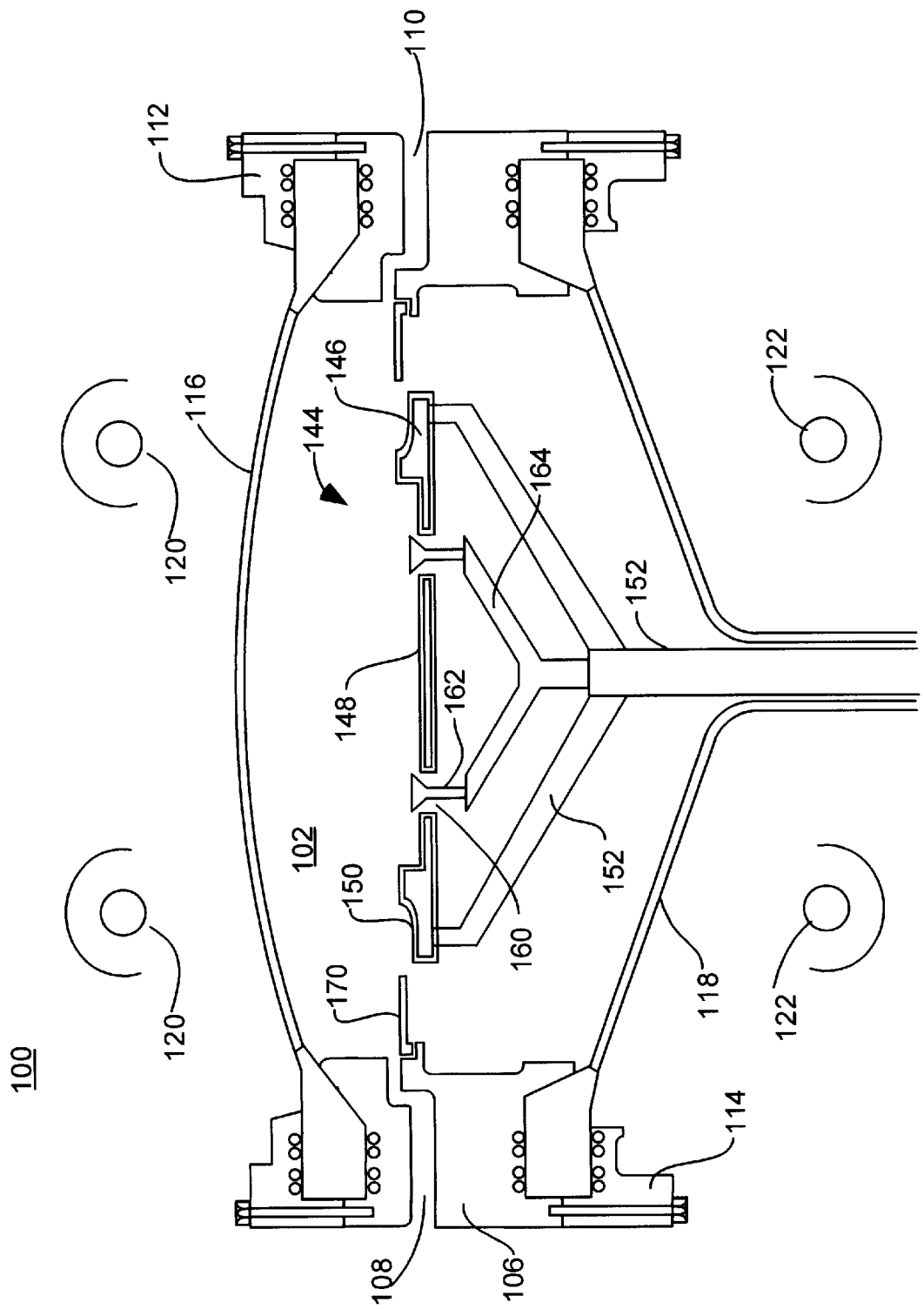
FIG. 1 is a cross-section side view of a semiconductor processing chamber.
Figure 2:
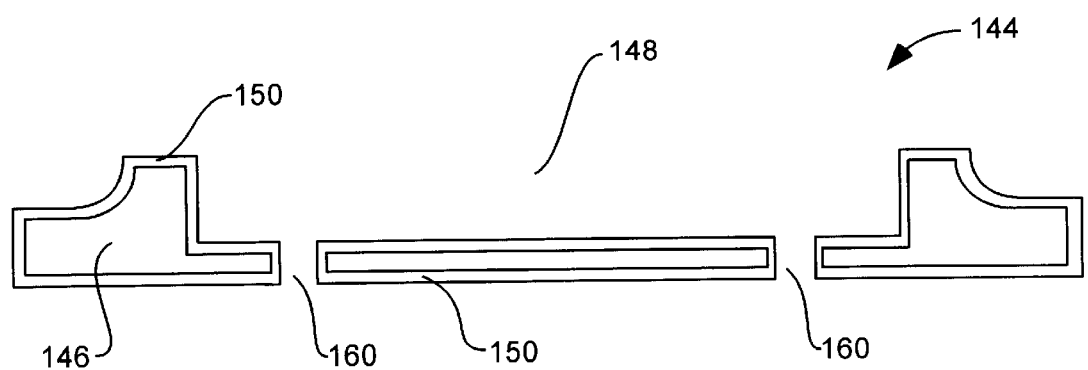
FIG. 2 is a cross-section side view of a susceptor in one embodiment of the present invention.

With reference to FIGS. 1 and 2, a semiconductor processing chamber and a diamond coated susceptor are shown. Processing chamber 100 includes an inner chamber 102 for facilitating the flow of a process gas over the surface of a wafer. The processing chamber housing includes a main body 106 having a gas inlet port 108 and a gas exhaust port 110. An upper clamp ring 112 and a lower clamp ring 114 act to hold an upper quartz window 116 and a lower quartz window 118 to the main body 106 of the processing chamber 100. Process gas is injected into the inner chamber 102 through gas inlet port 108, which is connected to a gas source. Residual process gas and various waste products are removed from the interior of chamber 102 through exhaust port 110. An upper heating source 120 mounted above window 116 and a lower heating source 122 mounted below lower window 118 provide infra-red radiant heat into the inner chamber 102 through the respective windows which are transparent to infra-red radiation.

A susceptor 144 is provided within inner chamber 102 for supporting a wafer. Susceptor 144 includes a body 146 having a recess 148 or other means for retaining a wafer within the susceptor. The susceptor body 146 is coated with a diamond film 150. Susceptor 144 is coupled to a mounting fixture 152 that rotatably supports the susceptor within the chamber. In this manner, a wafer (not shown) supported within the susceptor 144 may be rotated during processing to permit a more uniform heating and deposition. Although FIG. 1 shows the susceptor 144 being rotatably supported within the chamber, it is appreciated that the susceptor 144 may be fixedly mounted. Susceptor 144 also includes a plurality of through holes 160 for receiving at least three loading pins 162. Loading pins 162 are mounted to a support shaft 164 that provides vertical movement to raise and lower pins 162. Pins 162 are used to raise a wafer above the susceptor seating surface while the wafer is being loaded and unloaded from the processing chamber.

An annular pre-heat ring 170 positioned on the main body 106 of the processing chamber encircles susceptor 144. The pre-heat ring 170 is typically made of silicon carbide coated graphite or quartz, depending upon the particular type of processing chamber being used.

As previously discussed, during the processing of a wafer a deposition film is deposited onto the surface of the wafer substrate and also on the surfaces of other components within the processing chamber, including the susceptor. As a result, the processing chamber and susceptor are routinely cleaned by introducing an etchant into the chamber to remove the deposited film from the surfaces of the susceptor and other chamber components. Since diamond is substantially inert to most etchants, including fluorine gas, the problems associated with etching deposition films from the surface of the susceptor are obviated by the present invention.

The body 146 of susceptor 144 is typically made of graphite. It is appreciated, however, that the body 146 may be made of other materials such as silicon carbide, silicon nitride, aluminum nitride and other ceramics. A metal material having a protective coating may also be used. In one embodiment the diamond film 150 is chemical vapor deposited onto the susceptor 144 to a thickness in the range of 7 to 15 microns. Other deposition methods may also be used.

Another advantage of the present invention is that the diamond film 150 has a high thermal conductivity. Since the diamond film 150 has a high thermal conductivity, heat is spread more uniformly and more quickly to the wafer during processing. This results in a faster process, which increases wafer through put. Better yields are also achieved due to better temperature uniformity across the wafer.

Figure 3:
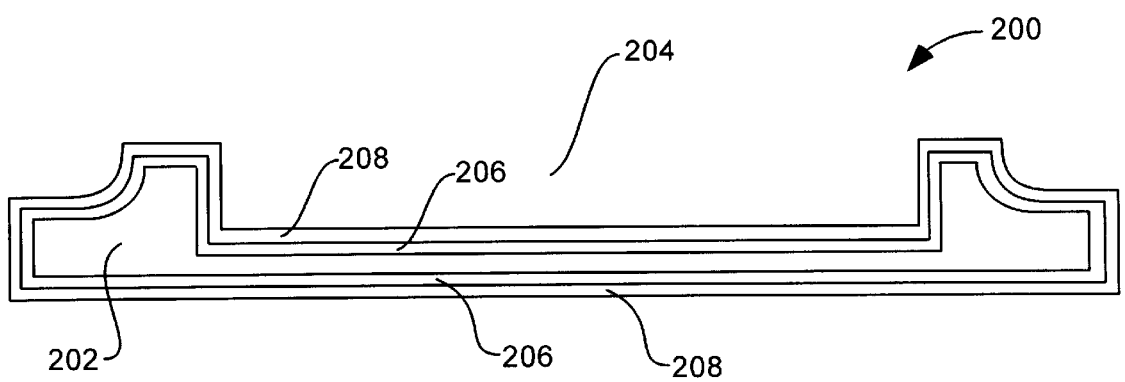
FIG. 3 is a cross-section side view of a susceptor in another embodiment of the present invention.

FIG. 3 illustrates a susceptor 200 in another embodiment of the invention. Susceptor 200 includes a graphite body 202 having a recess 204 for retaining a wafer within the susceptor. Body 202 has a silicon carbide coating 204 deposited over the surface of the susceptor body. A diamond film 206 is deposited over the silicon carbide coating 204. In one embodiment, the silicon carbide coating 204 has a thickness in the range of 200 to 300 microns and the diamond film 206 has a thickness in the range of 7 to 15 microns.

Figure 4:
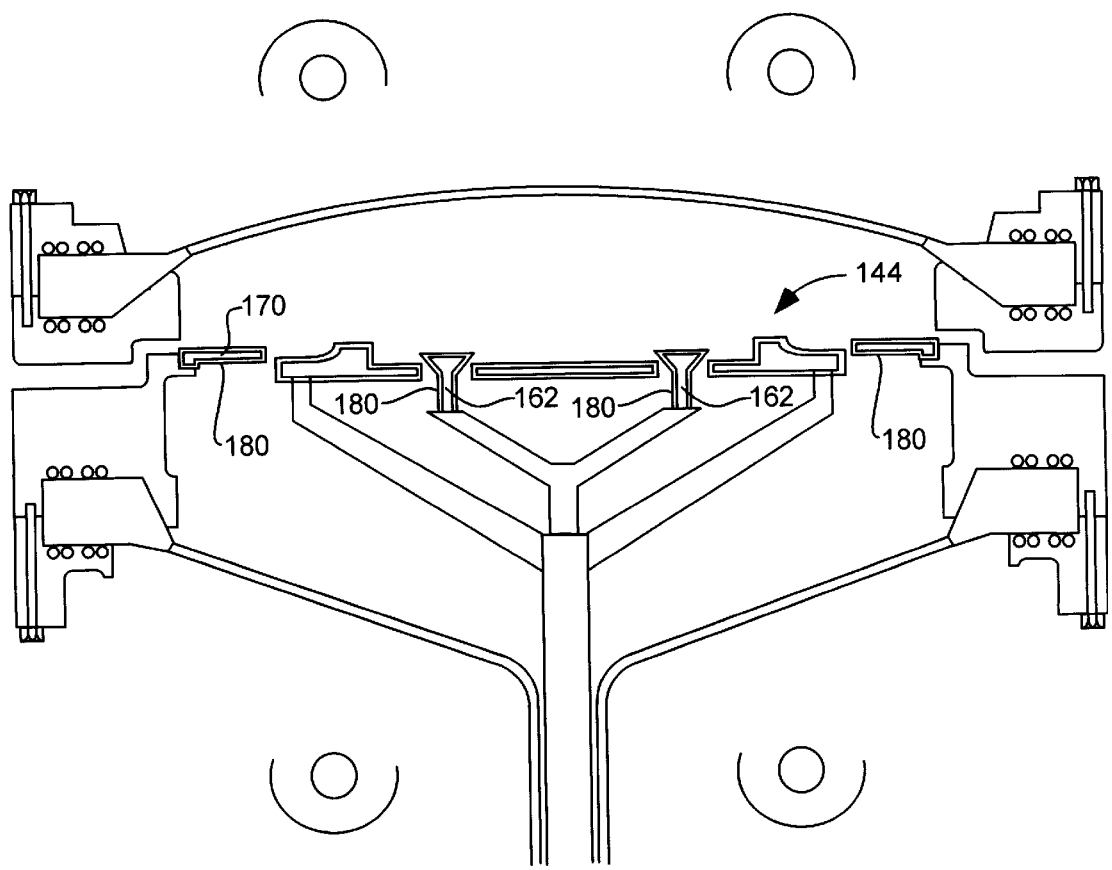
FIG. 4 is a cross-section side view of a semiconductor processing chamber in another embodiment of the present invention.

The preceding discussion has thus been limited to a diamond coated susceptor. It is appreciated, however, that other semiconductor processing chamber components may also be diamond coated. For example, the pre-heat ring 170 and the wafer loading pins 162 may be coated with a diamond film 180 as shown in FIG. 4.

It is appreciated that the apparatus of the present invention may be used for multiple wafer processing and single wafer processing. It is further understood that the relative dimensions, geometric shapes, materials and process techniques set forth within the specification are exemplary of the disclosed embodiments only. Whereas many alterations and modifications to the present invention will no doubt become apparent to a person ordinarily skilled in the art having read the foregoing description, it is to be understood that the particular embodiments shown and described by way of illustration are in no way intended to be limiting. Therefore, reference to the details of the illustrated diagrams is not intended to limit the scope of the claims which themselves recite only those features regarded as essential to the invention.

What is claimed is:

1. A susceptor comprising:
   a body; and
   a diamond film covering at least a portion of the body.

2. The susceptor of claim 1 wherein the body is made of graphite.

3. The susceptor of claim 1 wherein the diamond film has a thickness in the range of 7 to 15 microns.

4. The susceptor of claim 1 wherein the diamond film is vapor deposited onto the susceptor body.

5. The susceptor of claim 1 wherein the diamond film is chemical vapor deposited onto the susceptor body.

6. The susceptor of claim 1 further comprising a plurality of wafer loading pins located in through openings in the susceptor body, the outer surface of the loading pins being coated with a diamond film.

7. A susceptor comprising:
   a body;
   a silicon carbide coating on the surface of the body; and
   a diamond film disposed over at least a portion of the silicon carbide coating.

8. The susceptor of claim 7 wherein the body is made of graphite.

9. The susceptor of claim 7 wherein the diamond film has a thickness in the range of 7 to 15 microns.

10. The susceptor of claim 7 wherein the silicon carbide coating has a thickness in the range of 200 to 300 microns.

11. The susceptor of claim 7 wherein the diamond film is vapor deposited onto the susceptor body.

12. The susceptor of claim 7 wherein the diamond film is chemical vapor deposited onto the susceptor body.

13. A semiconductor wafer processing chamber comprising:
   a housing defining an inner chamber; and
   a susceptor in the inner chamber configured to hold at least one wafer, at least a portion of an outer surface of the susceptor being coated with a diamond film.

14. The semiconductor wafer processing chamber of claim 13 wherein the diamond film has a thickness in the range of 7 to 15 microns.

15. The semiconductor wafer processing chamber of claim 13 wherein the diamond film is vapor deposited onto the susceptor.

16. The semiconductor wafer processing chamber of claim 13 further comprising a plurality of wafer loading pins located in through openings in the susceptor body, the outer surface of the loading pins being coated with a diamond film.

17. A semiconductor processing chamber comprising:
   a susceptor for supporting a wafer; and
   a plurality of wafer loading pins located in through openings in the susceptor, the outer surface of the loading pins being coated with a diamond film.

18. The semiconductor processing chamber of claim 17 wherein the diamond film has a thickness in the range of 7 to 15 microns.

19. The semiconductor processing chamber of claim 17 wherein the diamond film is vapor deposited onto the wafer loading pins.

20. The semiconductor processing chamber of claim 17 wherein the diamond film is chemical vapor deposited onto the susceptor body.

* * * * *